(12) United States Patent
Chen et al.

(10) Patent No.: US 9,368,772 B1
(45) Date of Patent: Jun. 14, 2016

(54) PACKAGING AND TERMINATION STRUCTURE FOR A SOLID STATE BATTERY

(71) Applicant: SAKTI3, INC., Ann Arbor, MI (US)

(72) Inventors: Yen-Hung Chen, Ann Arbor, MI (US); Chia-Wei Wang, Ann Arbor, MI (US); Ann Marie Sastry, Ann Arbor, MI (US); Xiangchun Zhang, Ann Arbor, MI (US); Myoungdo Chung, Ann Arbor, MI (US); HyonCheol Kim, Ann Arbor, MI (US); Svetlana Lukich, Ann Arbor, MI (US); Thomas Weigman, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 289 days.

(21) Appl. No.: 14/170,445

(22) Filed: Jan. 31, 2014

Related U.S. Application Data

(60) Provisional application No. 61/759,361, filed on Jan. 31, 2013, provisional application No. 61/759,372, filed on Jan. 31, 2013, provisional application No. 61/759,365, filed on Jan. 31, 2013, provisional application No. 61/759,368, filed on Jan. 31, 2013, provisional application No. 61/759,364, filed on Jan. 31, 2013.

(51) Int. Cl.
| | |
|---|---|
| *H01M 2/20* | (2006.01) |
| *H01M 2/10* | (2006.01) |
| *B05D 1/02* | (2006.01) |
| *B05D 1/18* | (2006.01) |
| *B05D 1/30* | (2006.01) |
| *C23C 14/22* | (2006.01) |
| *C23C 16/00* | (2006.01) |

(52) U.S. Cl.
CPC ............ *H01M 2/1094* (2013.01); *B05D 1/02* (2013.01); *B05D 1/18* (2013.01); *B05D 1/30* (2013.01); *C23C 14/22* (2013.01); *C23C 16/00* (2013.01); *H01M 2/20* (2013.01)

(58) Field of Classification Search
CPC ....... H01M 2/20; H01M 2/204; H01M 2/206; H01M 2/1094; B05D 1/02; B05D 1/18; B05D 1/30; C23C 14/22; C23C 16/00
See application file for complete search history.

(56) References Cited

U.S. PATENT DOCUMENTS

| | | | |
|---|---|---|---|
| 2002/0146620 A1* | 10/2002 | Connell | H01M 2/0277 429/161 |
| 2007/0009794 A1* | 1/2007 | Takami | H01M 2/021 429/184 |
| 2011/0188169 A1* | 8/2011 | Park | H01G 4/30 361/301.4 |

* cited by examiner

*Primary Examiner* — Brittany Raymond
(74) *Attorney, Agent, or Firm* — Morrison & Foerster LLP

(57) ABSTRACT

A method for fabricating a solid state battery device. The device can include electrochemically active layers and an overlaying barrier material, with an inter-digitated layer structure configured with a post terminated lead structure. The method can include forming a plurality of battery device cell regions (1-N) formed in a multi-stacked configuration, wherein each of the battery device cell regions comprises a first current collector and a second current collector. The method can also include forming a thickness of a first and second lead material to cause formation of a first and second lead structure to interconnect each of the first and second current collectors associated with each of the plurality of battery device cell regions and to isolate each of the second current collectors extending spatially outside of the battery device cell region within a first and second isolated region, respectively.

5 Claims, 15 Drawing Sheets

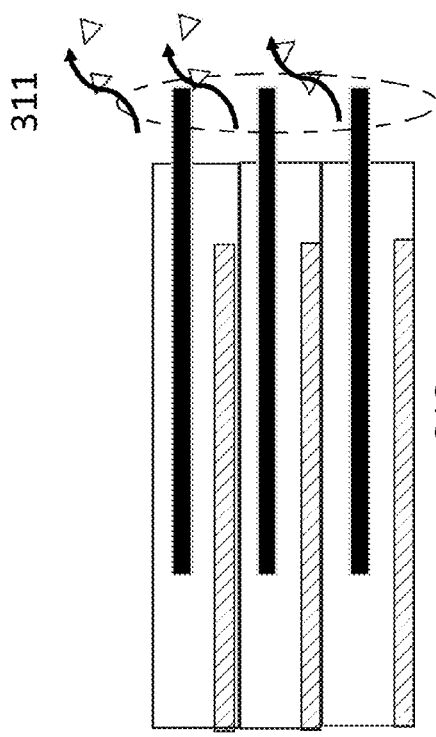
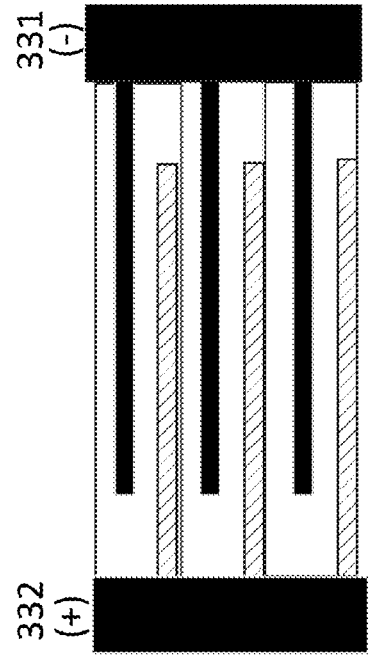
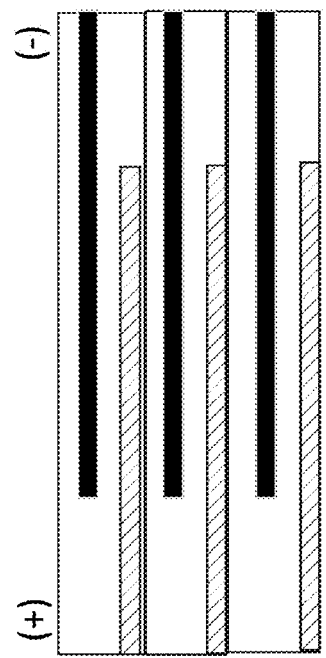
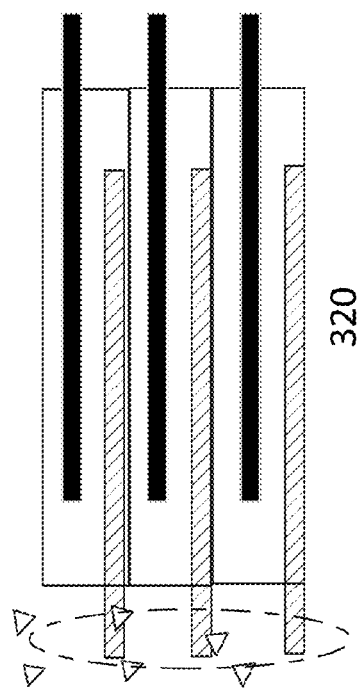
FIG. 3A
FIG. 3B
FIG. 3C
FIG. 3D

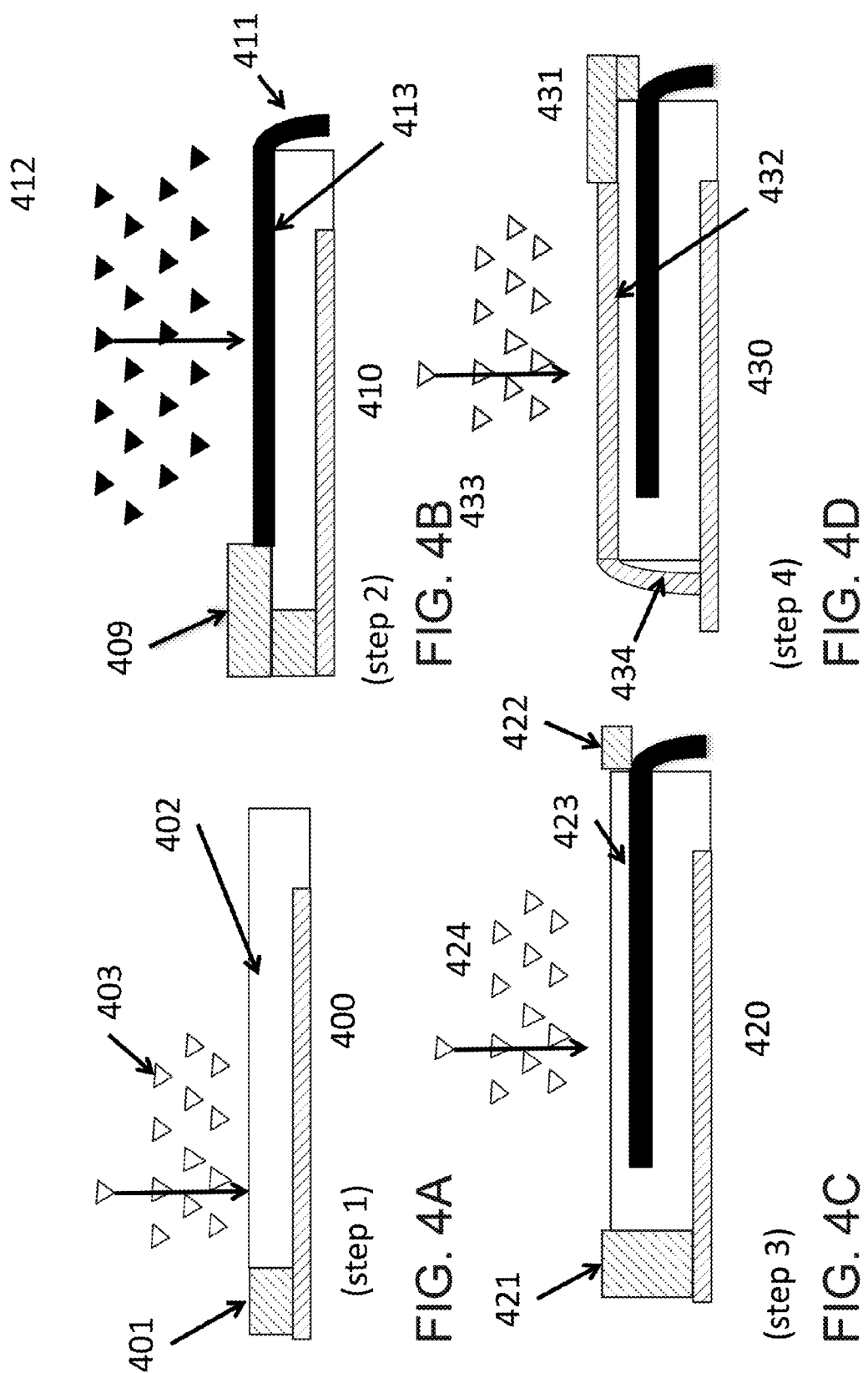

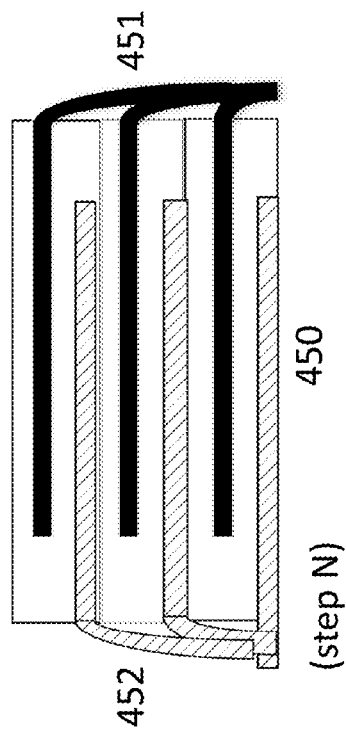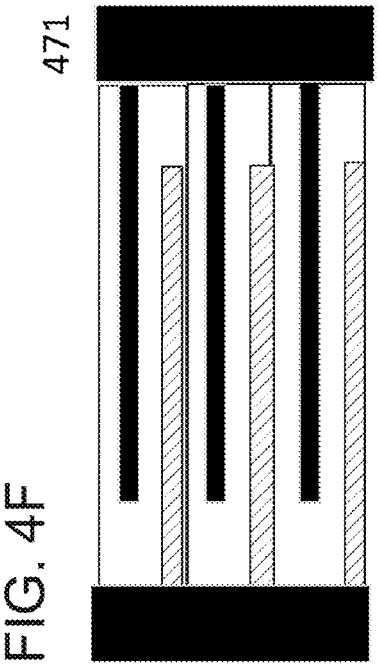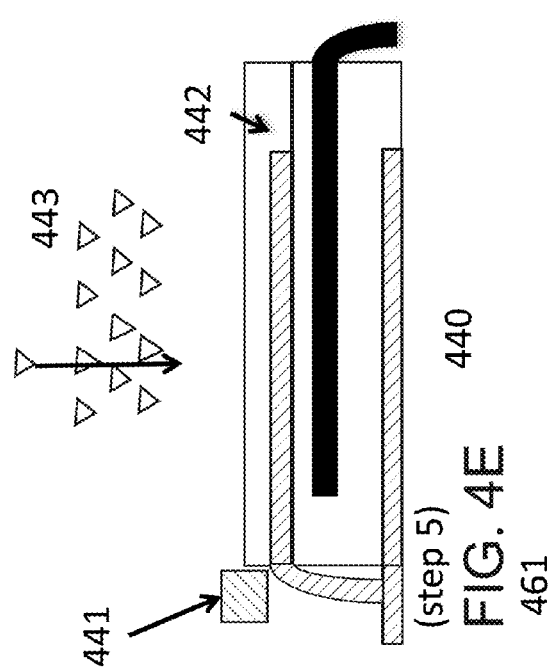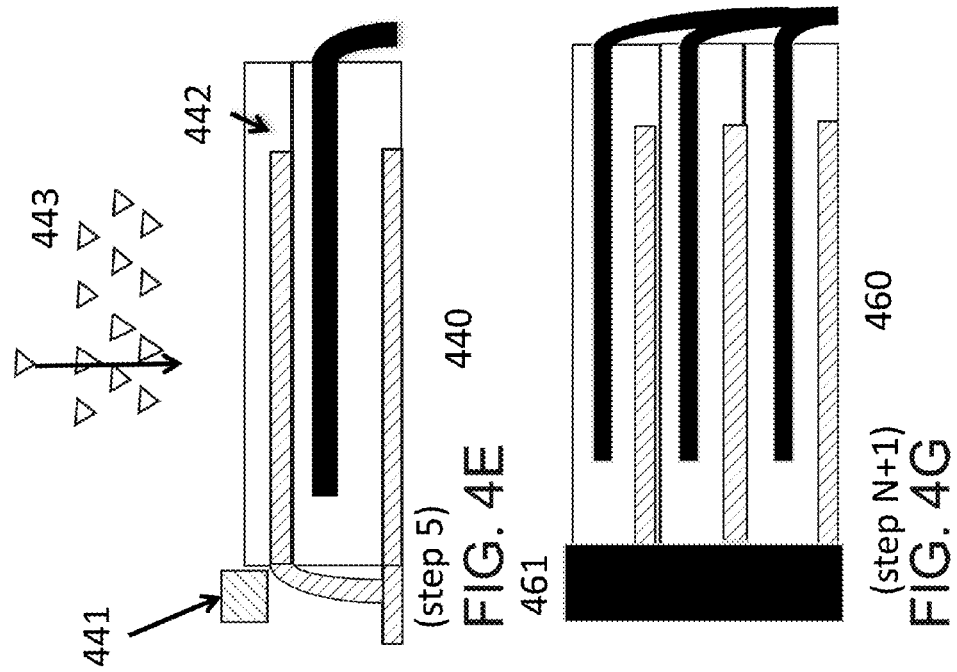

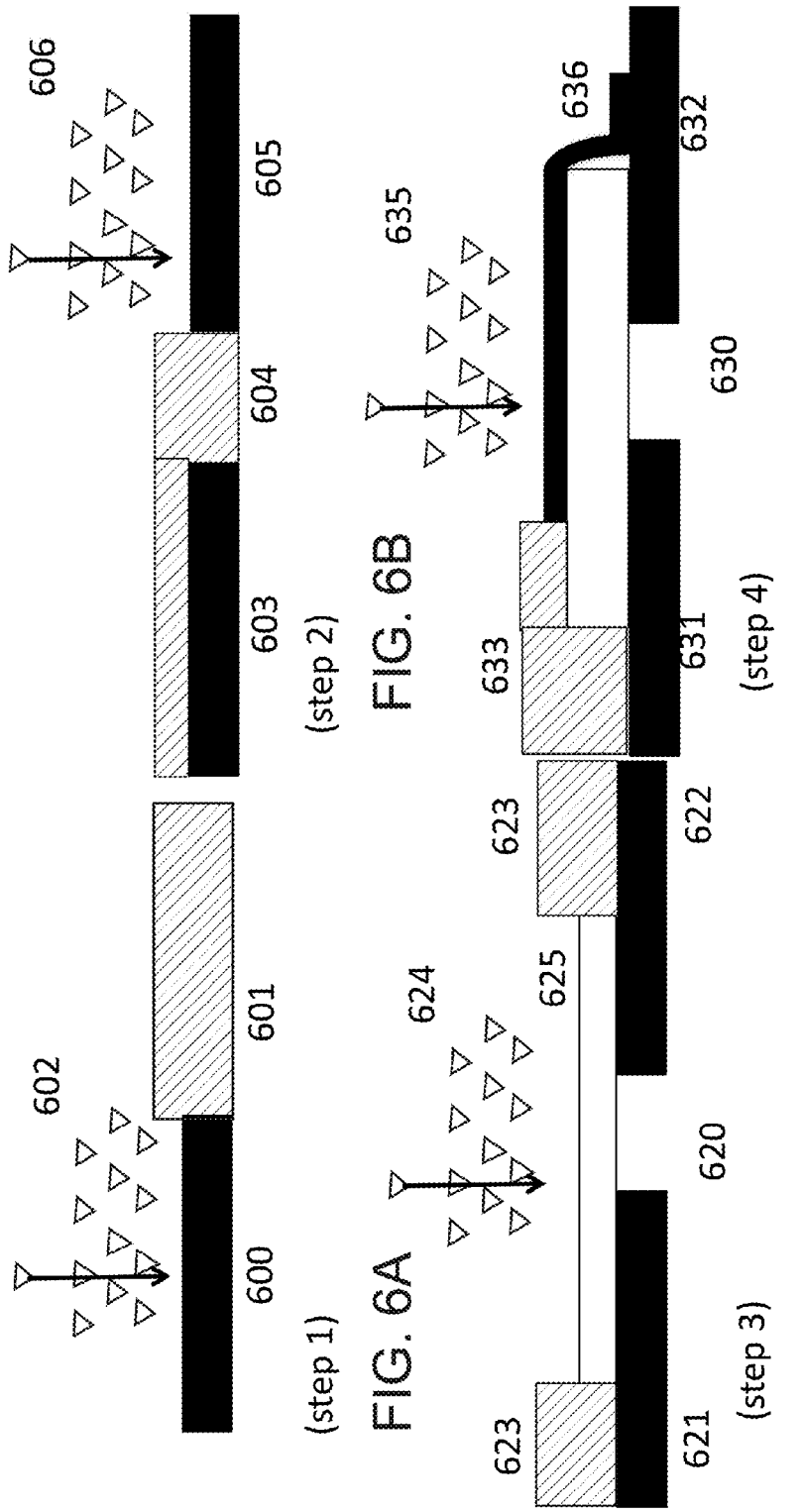

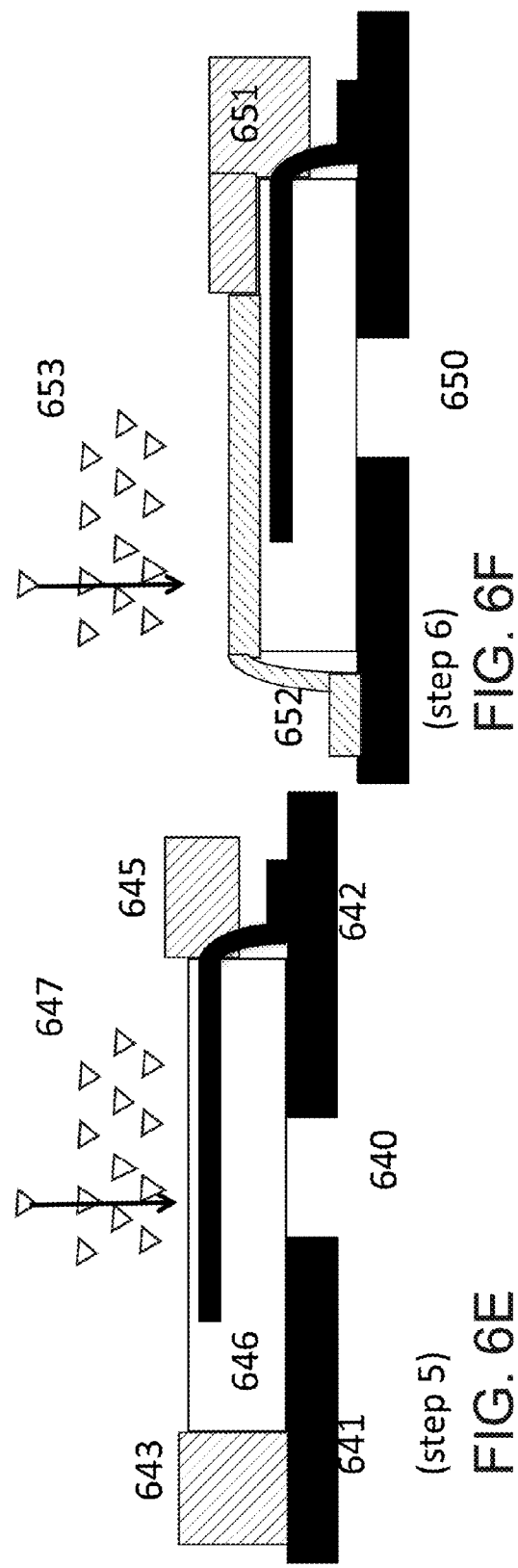

In series

In parallel

▨ Ni-Cu spray
▧ anode c.c.
▦ anode
⋯ electrolyte
· cathode
▨ cathode c.c.

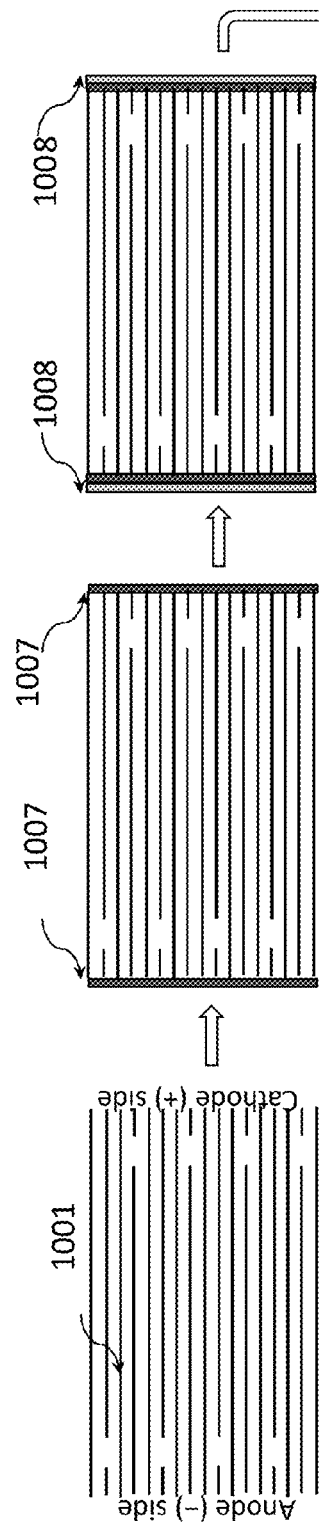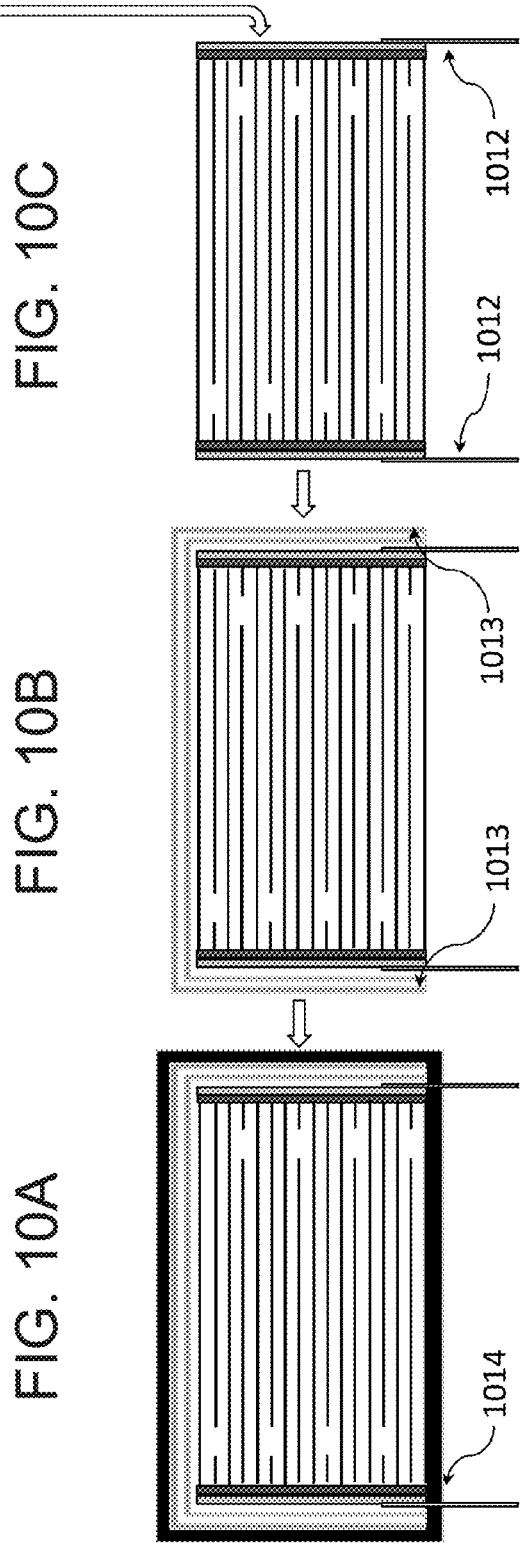

PACKAGING AND TERMINATION STRUCTURE FOR A SOLID STATE BATTERY

CROSS-REFERENCES TO RELATED APPLICATIONS

The present application claims priority to and incorporates by reference, for all purposes, the following patent application: U.S. Provisional App. 61/759,364, filed Jan. 31, 2013. The present application also incorporates by reference, for all purposes, the following pending patent applications: U.S. patent application Ser. No. 12/484,966, filed Jun. 15, 2009, U.S. Provisional App. 61/759,361, filed Jan. 31, 2013, U.S. Provisional App. 61/759,372, filed Jan. 31, 2013, U.S. Provisional App. 61/759,365, filed Jan. 31, 2013, and U.S. Provisional App. 61/759,368, filed Jan. 31, 2013.

BACKGROUND OF THE INVENTION

This present invention relates to manufacture of electrochemical cells. More particularly, the present invention provides a process and method for manufacturing a solid-state thin film battery device. Merely by way of example, the invention has been described with the use of lithium based cells, but it is recognized that other materials such as zinc, silver, copper, cobalt, iron, manganese, magnesium and nickel could be designed in the same or like fashion.

Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

In solid state thin film batteries, those knowledgeable in the field have attempted to build multi-layer, or stacked solid state batteries, but have been limited to only a few stacked cells due to manufacturing problems. This is evidenced by the fact that to date, only miniature solid state batteries have been commercialized for use on credit cards or RFID tag. Those skilled in the art have been unable to manufacture thin film solid-state batteries useful in replacing conventional technology, particularly those batteries for extended use in consumer electronics or in automobiles.

As applications continue to require greater power and efficiency from energy sources such as these batteries, techniques for improving solid-state thin film battery devices continue to be highly desired.

BRIEF SUMMARY OF THE INVENTION

According to the present invention, a method related to manufacture of electrochemical cells is provided. More particularly, the present invention provides a method of manufacturing a solid state thin film battery device. Merely by way of example, the invention has been provided with use of lithium based cells, but it would be recognized that other materials described above, could be designed in the same or like fashion.

Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

In a specific embodiment, the present invention provides a method for fabricating a solid state battery device with inter-digitated layer structure configured with a post terminated lead structure. The method includes forming a plurality of battery device cell regions formed in a multi-stacked configuration, the plurality of battery device cell region numbered from 1 through N, where N is an integer greater than 1; each of the battery device cell regions comprising a first current collector and a second current collector, the first current collector extending spatially outside of the battery device cell region and the second current collector extending spatially outside of the battery device cell region.

The method also includes forming, using at least a first deposition process, a thickness of first lead material to cause formation of a first lead structure to interconnect each of the first current collectors associated with each of the plurality of battery device cell regions and to isolate each of the second current collectors extending spatially outside of the battery device cell region with first isolated region; and forming, using a least a second deposition process, a thickness of second lead material to cause formation of a second lead structure to interconnect each of the second current collectors associated with each of the plurality of battery cell regions and to isolate each of the first current collectors extending spatially outside of the battery device cell region with second isolated region.

In a preferred embodiment, the solid state battery comprises an anode, cathode, separator, electrolyte, current collectors, substrate, and an overlaying barrier material. The method also includes a first lead material and a second lead material are formed as termination region by removing the battery layer materials by one of etching, masking, laser ablation, and micro-machining. The method also includes a first lead material and a second lead material are formed as termination region by deposition process with masking. Preferably, the length of a first isolated region and a second isolated region designed to reduce non-active material (non-anode and cathode material) to achieve high energy density.

In an alternative specific embodiment, the present invention provides a solid state battery device comprising a substrate member comprising a surface region, the substrate member having a length and a width. The a solid state battery device also comprises a plurality of cathode electrode members configured from a first end to a second end and overlaying the substrate member, each of the plurality of cathode electrode members comprising an outer end and an inner end. The a solid state battery device also comprises a plurality of anode electrode members configured from the second end to the first end and overlaying the substrate member, each of the plurality of the plurality of anode electrode members comprising an outer end and an inner end. In the solid state battery, an inter-digitated configuration is formed from the plurality of cathode electrode members and the plurality of anode electrode members. The solid state battery device also comprises a cathode termination region formed overlaying each of the outer ends of the plurality of cathode electrode members and an anode termination region formed overlaying each of the outer ends of the plurality of anode electrode members.

In the solid state battery, an electrolyte material is provided between each pair of cathode electrode members and anode electrode members.

The present invention also provides a method that each of the anode termination region and the cathode termination region is provided by one of welding, soldering, spraying, painting, ultrasonic welding, brushing, dipping, and similar process. Preferably, each pair of anode electrode members and cathode electrode members is for a single battery cell. The method also includes a first tab electrically and mechanically coupled to a first portion of the substrate, the first portion being coupled to the anode termination region; and further comprising a second tab electrically and mechanically coupled to a second portion of the substrate, the second portion being coupled to the cathode termination region; wherein the first portion and the second portion being opposite of the surface region of the substrate.

As an example, electrically and mechanically coupling methods processes to attach leads, tabs, wires, and other connectors to the anode and cathode termination can be used by one of resistance welding, ultrasonic welding, laser welding, pulse arc welding, capacitor discharge welding, spot welding, ultrasonic soldering, spraying, painting, ultrasonic welding, brushing, dipping, brazing, crimping, adhesion, pinning, and similar process. Preferably, the plurality of anode electrode members are configured in parallel or serial arrangement and coupled to the anode or cathode termination region; and wherein the plurality of cathode electrode members are configured in parallel or serial arrangement and coupled to the cathode or anode termination region.

In a preferred embodiment, a method is provided for forming internal packaging layers for a multilayer solid-state. The method includes an internal packaging multilayer of the battery element that defines an upper surface, front surface, rare surface, and side surface, including the termination joints, wherein the internal packaging layers include a plurality of PML and aluminum layers and provide hermetical seal to the battery element. Preferably, the internal packaging multilayer that serves as a moisture barrier to the battery element and the internal packaging multilayer of the battery element, the packaging PML layer thickness ranges from 0.5 μm to 100 μm and the metal, metal nitride, metal carbide, or metal oxide layer thickness ranges from 0.03 μm to 10 μm.

The method also includes the packaging layers which provide a hermetically enclosure of the battery element, wherein has water vapor transmission rate to $\leq 10^{-5}$ g/m$^2$/day. Preferably, internal packaging layers form a conformal coating housing for a battery element, further encapsulating the battery element in a polymer based coating, wherein the conformal coating provides adequate rigidity and mechanical protection to the battery element and serves as an external packaging layer. As an example, the polymer based coating is formed from one or two component epoxy resin, UV curable epoxy, thermoplastics, acrylate ceramics, polyurethane, silicone, liquid crystals, silica, carbon black or combinations. Additionally, the conformal coating comprises an additional moisture barrier and static discharge material. Preferably, the conformal coating layer thickness ranges from 10 μm to 1000 μm.

Benefits are achieved over conventional techniques. Depending upon the specific embodiment, one or more of these benefits may be achieved. In a preferred embodiment, the present invention provides a hermetic packaging device for a solid-state battery and a method for making same. In a specific embodiment, the present invention provides a method for forming a self terminated electrode structure configured with a solid state multilayered battery device. In a preferred embodiment, the present invention provides an intrinsically safe packaging device for a solid-state battery and a method for making same. Preferably, the present package and method protects the active components from atmospheric elements and at the same time minimizes the parasitic mass and volume to optimize the battery energy density. Preferably, the present invention includes a method and device for a conformal solid-state package, which can accurately encapsulate a battery device, while protecting the battery electrically, mechanically, and environmentally. Of course, there can be other variations, modifications, and alternatives.

Depending upon the specific embodiment, one or more of these benefits may be achieved. Of course, there can be other variations, modifications, and alternatives. The present invention achieves these benefits and others in the context of unique and non-intuitive process technology. However, a further understanding of the nature and advantages of the present invention may be realized by reference to the latter portions of the specification and attached drawings. It is also clear that embodiments of the invention must be optimized or changed for materials and layer thicknesses; however, the intrinsic invention and its purpose are conserved.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 3A-3D are simplified cross-sectional diagrams illustrating a sequence for producing a post terminated battery by material removal according to an embodiment of the present invention.

FIGS. 4A-4H are simplified cross-sectional diagrams illustrating a sequence for producing a post terminated battery by masking according to an embodiment of the present invention.

FIGS. 6A-6G are simplified cross-sectional diagrams illustrating a sequence for producing a post terminated battery according to an embodiment of the present invention.

FIGS. 10A-10F are simplified cross-sectional diagrams illustrating a method for terminating and packaging a battery device according to an embodiment of the present invention.

DETAILED DESCRIPTION OF THE INVENTION

Figure 1:
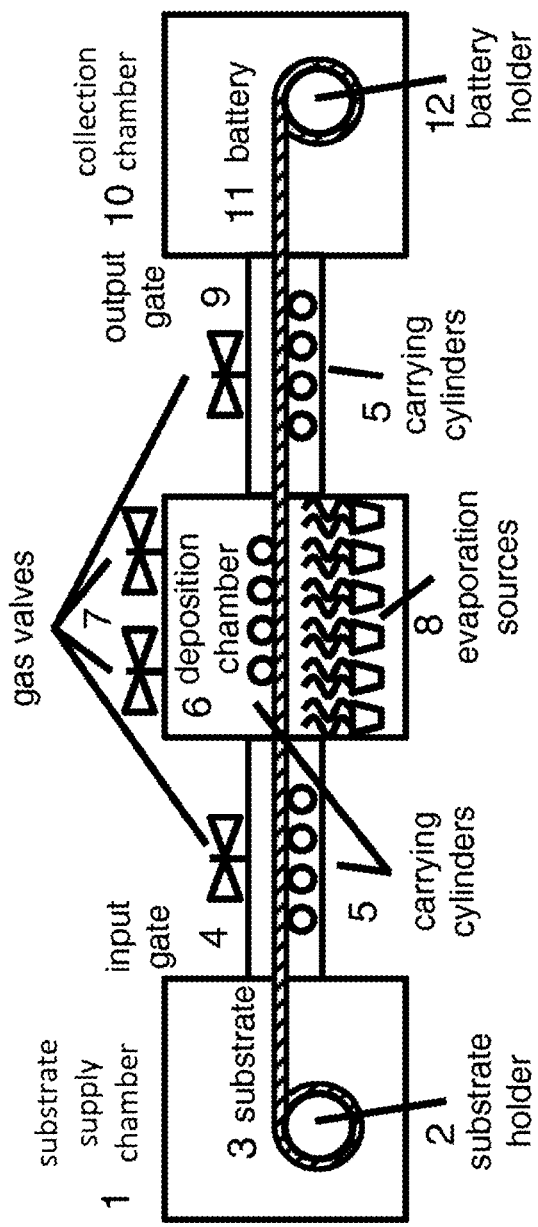
FIG. 1 is a simplified diagram of an apparatus for making a solid state battery according to an embodiment of the present invention.

According to the present invention, techniques for solid state batteries are provided. More particularly, the present invention provides a method for termination and packaging structures that are monolithically integrated with solid state battery cells. Merely by way of example, the invention has been applied to solid state battery cells, although there may be a wide variety of other applications.

Lithium ion batteries must occupy substantial three-dimensional volumes to be useful. By way of example, those used in the Apple iPhone 4® and the GM Volt® achieve this usefulness by being deposited on a web or flexible substrate and stacked or wound with separator webs and current collector webs to form a size and electrical performance suitable for use. The wound or stacked devices are then terminated by a number of means, all of which use an excess of space and weight to compensate for small area electrical connections due to manufacturing problems associated with termination along the entire length of the current collectors.

As for solid-state technology, those in the field have attempted to build multi-layer, or stacked solid-state batteries, deposited one upon the other, but have been limited to only a single layer of cells due to manufacturing problems. These manufacturing problems include the difficulties of building multiple stacks one upon the other without transmitting defects and systematically increasing the roughness of layers or stress in the layers. Asperity and roughness in previous layers are propagated to subsequent layers, which prevents the manufacturing of a multiple stack structure. Considering that thousands of stacked layers are desired to be competitive in the current market, conventional techniques for thin film battery devices are inadequate.

Battery connection is critical for forming battery module or even battery pack. The success of transporting electrical energy to power external devices, such as mobile phone or electrical vehicle, requires robust of connection. At the same time, design of the termination region and connections of current leads can also be served as the safety component during manufacturing and functional cycles, and as quality control component during the manufacturing cycle. In this patent, we have invented design and method of producing the similar for the connectors (leads), which can be integrated with the whole throughput manufacturing process proposed by us in US20090325063. This design and manufacturing method can reduce the failure of the connection, and increase the safety factor during the functional cycles, and increase the quality of the battery. Because all components of the electrochemical cell are in solid-state, it is suitable integrate the formation of termination regions and connectors (leads) with the production process of electrochemical cells as describe in the first embodiment. In the second embodiment, design has been invented so that the connection of leads can be implemented easily.

Conventional metal Lithium of thin film solid-state batteries reacts rapidly to atmospheric elements such as oxygen, nitrogen, carbon dioxide and water vapor. Thus, the lithium anode of a thin film battery will react in an undesirable manner on exposure to such elements if the anode is not suitably packaged. An example of a package is discussed by Zhang in U.S. Pat. No. 7,204,862 B1, which is directed to a heat sealable package containing a thin Al or other metal foil as the barrier layer, a nylon outer layer for structural strength and a heat sealable polymer such as polyethylene (PE) or polypropylene (PP) as the heat seal layer. Another example is shown by Bates in U.S. Pat. No. 6,387,563 B1. Bates is directed to a method that uses a UV curable epoxy to seal a cover glass over the thin film battery deposited on a rigid ceramic substrate. Bates also discusses an alternate method in U.S. Pat. No. 5,561,004 B1 that uses a multilayer coating using alternating layers of polymer and ceramic or polymer and ceramic and metal barrier layers. Limitations, however, exist with these conventional techniques. Such techniques often rely upon cumbersome packages, which are expensive, and may also use complex equipment and processes.

To further complicate matters, conventional Li-ion battery technology uses a liquid or polymer electrolyte to carry the lithium ions between the anode and cathode during charge and discharge cycling. These electrolytes are complex formulations of solvents and salts that contain many additives to obviscate issues with reaction at the interface of the liquid with the cathode or anode interface. The packaging method for the existing technology must therefore contain the electrolyte during the packaging process to prevent it from running out of the cell or contaminating the packaging process. In addition, as disclosed by Fukuda et al in U.S. Pat. No. 6,245,456 B1, the packaging material must often be benign to the solvents and other additives that form the electrolyte solution. Taken together these factors are limiting in the methods that can be used to package existing Li-ion battery technologies.

In the first embodiment of this invention, a method of forming solid-state batteries and leads by using a vacuum deposition apparatus so that said solid-state batteries can be connected in series or in parallel based on the applications. The present invention provides a method for fabricating a solid state battery device with inter-digitated layer structure configured with a post terminated lead structure. More particularly, the method includes forming a plurality of battery device cell regions formed in a multi-stacked configuration, and each of the battery device cell regions comprising a first current collector and a second current collector, the first current collector extending spatially outside of the battery device cell region and the second current collector extending spatially outside of the battery device cell region. The method also includes a first lead material and a second lead material are formed as termination region by removing the battery layer materials by one of etching, laser ablation, and micro-machining. The method also includes a first lead material and a second lead material are formed as termination region by deposition process with masking Preferably, the length of a first isolated region and a second isolated region designed to reduce non-active material (non-anode and cathode material) to achieve high energy density.

The present invention also provides a solid state battery device comprising a substrate member comprising a surface region, the substrate member having a length and a width. The solid state battery device also comprises a plurality of cathode electrode members configured from a first end to a second end and overlaying the substrate member, each of the plurality of cathode electrode members comprising an outer end and an inner end. The a solid state battery device also comprises a plurality of anode electrode members configured from the second end to the first end and overlaying the substrate member, each of the plurality of the plurality of anode electrode members comprising an outer end and an inner end. In the solid state battery, an inter-digitated configuration is formed from the plurality of cathode electrode members and the plurality of anode electrode members. Additionally, a cathode termination region formed overlaying each of the outer ends of the plurality of cathode electrode members and an anode termination region formed overlaying each of the outer ends of the plurality of anode electrode members.

Meanwhile, each of the anode termination region and the cathode termination region is provided by one of welding, soldering, spraying, painting, ultrasonic welding, brushing, dipping, and similar process. The method also includes a first tab electrically and mechanically coupled to a first portion of the substrate, the first portion being coupled to the anode termination region; and further comprising a second tab electrically and mechanically coupled to a second portion of the substrate, the second portion being coupled to the cathode termination region; wherein the first portion and the second portion being opposite of the surface region of the substrate. Additionally, electrically and mechanically coupling methods processes to attach leads, tabs, wires, and other connectors to the anode and cathode termination can be used by hand soldering, ultrasonic soldering, discharge welding, resistance welding, laser welding, ultrasonic welding, etc. Preferably, the plurality of anode electrode members are configured in parallel or serial arrangement and coupled to the anode or cathode termination region; and wherein the plurality of cathode electrode members are configured in parallel or serial arrangement and coupled to the cathode or anode termination region.

The present invention also provides a method for forming internal packaging layers for a multilayer solid-state. The method includes an internal packaging multilayer of the battery element that defines an upper surface, front surface, rare surface, and side surface, including the termination joints, wherein the internal packaging layers include a plurality of PML, SiO2, metal, metal nitride, metal carbide, or metal oxide layers and provide hermetical seal to the battery element. Preferably, the internal packaging multilayer that serves as a moisture barrier to the battery element and the internal packaging multilayer of the battery element. Additionally, the method also includes the packaging layers which provide a hermetically enclosure of the battery element. Preferably, internal packaging layers form a conformal coating housing for a battery element, further encapsulating the battery element in a polymer based coating, wherein the conformal coating provides adequate rigidity and mechanical protection to the battery element and serves as an external packaging layer. Additionally, the polymer based coating is formed from one or two component epoxy resin, UV curable epoxy, thermoplastics, acrylate ceramics, polyurethane, silicone, liquid crystals, silica, carbon black or combinations. Preferably, the conformal coating comprises an additional moisture barrier and static discharge material. Further details of the present method and system can be found throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

FIG. 1 is a simplified diagram of an apparatus for making a solid state battery according to an embodiment of the present invention. As shown in FIG. 1, this device is capable of making a multilayer solid state lithium ion battery, among others as described in patent application US 2009/0325063, which is incorporated herein.

In one configuration, this apparatus utilizes a first load lock, a second load lock and at least one processing chamber. A web of flexible material, suitable to manufacture batteries on is threaded from the first load lock through the processing chamber to the second load lock.

The web material is then conducted in a forward direction to enable the first necessary battery layer to be deposited. As referenced, deposition methods may include sputtering, evaporation, PECVD, arc spray, printing and others. Materials may include those referenced for inclusion in solid state batteries. By including in the processing chamber sufficient varied deposition sources, it is possible to deposit all required layers of said battery.

Conversely, this apparatus may also conduct the web material backwards through the processing chamber and configuring the deposition chamber to deposit a second material. This back and forth motion may be extended until all layers are deposited.

Further, it is possible to utilize masking to delineate the deposition on the web substrate to only those areas desired. This will be illustrated in the following figures.

Figure 2:
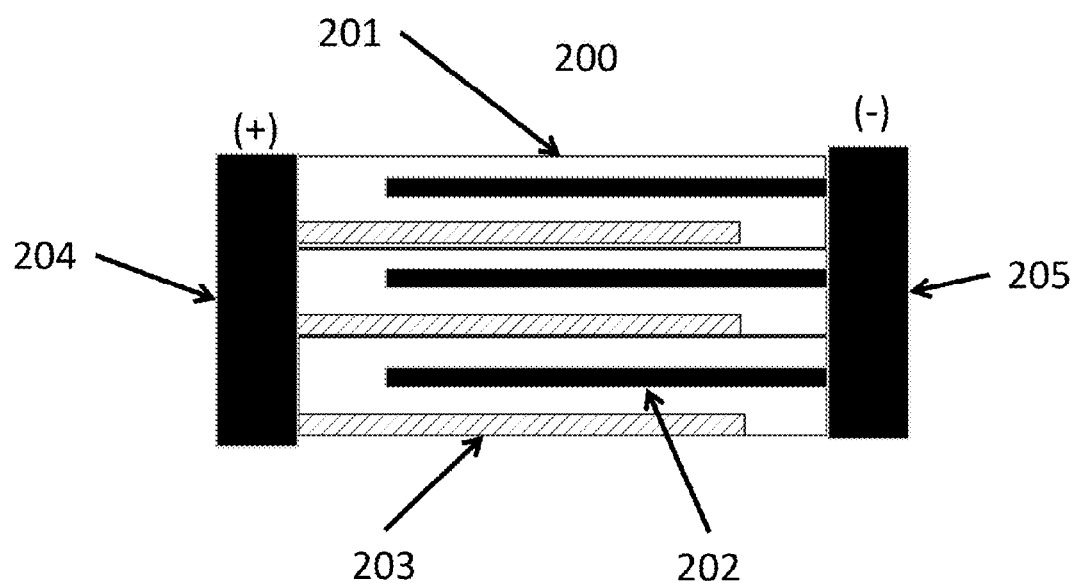
FIG. 2 is a simplified cross-sectional diagram of a solid state battery device according to an embodiment of the present invention.

FIG. 2 is a simplified cross-sectional diagram of a solid state battery device according to an embodiment of the present invention. FIG. 2 illustrates the post terminated battery. As can be seen in this figure, the cross section of a suitably terminated battery cell, 200, is illustrated. It can be clearly seen that methods of isolation techniques have been used to insure the cathode and anode current collectors, 202 and 203, are not connected to each other. 204 and 205 are cathode and anode terminating current collectors by coupling cathode and anode current collectors, 202 and 203, respectively with a margin at opposing internal edges. These current collectors 202 and 203 are then placed in intimate contact with the connection layer as shown. As illustrated, this connection layer, 201, extends the entire length of the current collector layer. It is to this connection layer that additional leads extending outside of a suitable package are connected.

FIGS. 3A-3D are simplified cross-sectional diagrams illustrating a sequence for producing a post terminated battery by material removal according to an embodiment of the present invention. As illustrated in FIG. 3a, the multiple layer solid state electrochemical cells, 300, are manufactured by preferable deposition method. In FIG. 3b utilizing a preferential removal process, basic battery stacks with internal current collector margins are exposed for a specific length as current collector leads by the removal of battery material, 311, separating them on one side. In this way, only the anode current collector leads, 312, are exposed.

Next in FIG. 3c, utilizing a preferential removal process, basic battery stacks, 320, with internal current collector margins are exposed for a specific length as anode collector leads by the removal of battery material, 321, separating them on one side. In this way, only the cathode current collector leads, 322, are exposed.

As illustrated in FIG. 3d, connection layers are placed on each end by connecting a plurality of anode current collectors and form anode terminating current collector, 331, on one side and form cathode terminating current collector, 332, on the other side. This separate arrangement insures no shorting between anode and cathode as shown.

FIGS. 4A-4H are simplified cross-sectional diagrams illustrating a sequence for producing a post terminated battery by masking according to an embodiment of the present invention. FIG. 4 illustrates the sequence for producing a post terminated battery by masking. As illustrated in FIG. 4A (step 1) to 4B (step 2), utilizing a preferred masking material, 409, basic battery stacks with internal current collector margins are exposed for a specific length by exposing battery material separating them on one side; thus, during deposition process of anode current collector material, 412, it allows to form one polarity current collector, 413, and exposed margin, anode current collector lead, 411.

Next in FIG. 4C (step 3) to 4D (step 4), utilizing a preferred masking material, 431, basic battery stacks, 430, with internal cathode current collector, 432, and exposed margin, 434, are exposed for a specific length by exposing battery material separating them on one side; thus, during deposition process of cathode current collector material, cathode current collector lead, 433.

As illustrated in FIG. 4E (steps N) to 4H (step N+2), leads of anode current collectors, 451, and leads of cathode current collectors, 452, are coupled on each end. Anode terminating current collector, 471, and cathode terminating current collector, 461, are then formed. This separate arrangement insures no shorting between anode and cathode as shown.

Figure 5:
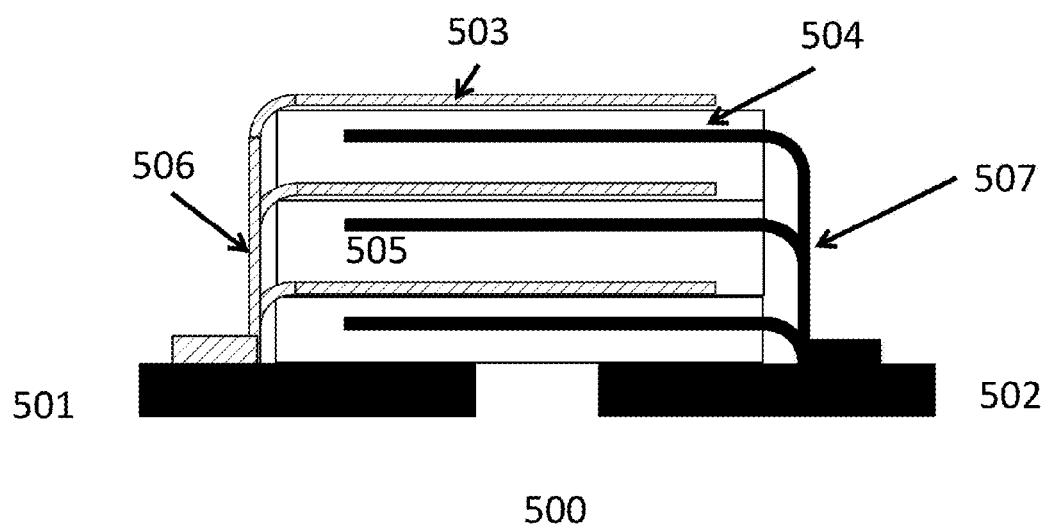
FIG. 5 is a simplified cross-sectional diagram of a self-terminated battery device according to an embodiment of the present invention.

FIG. 5 is a simplified cross-sectional diagram of a self-terminated battery device according to an embodiment of the present invention. FIG. 5 describes self-terminated battery. As can be seen in this figure, the cross section of a suitably terminated battery cell is illustrated. It can be clearly seen that masking is used to insure the cathode and anode current collectors, 503 and 504, are not connected to each other, but have a margin at opposing internal edges. These cathode and anode current collector leads, 506 and 507, are then placed in intimate contact each other as shown. As illustrated, this connection extends the entire length of the current collector layer. It is to this connection layer that additional leads extending outside of a suitable package are connected FIGS. 6A-6G are simplified cross-sectional diagrams illustrating a sequence for producing a post terminated battery according to an embodiment of the present invention. These figures illustrate the sequence for producing a self-terminated battery. As can be seen in steps 1 (FIG. 6A) to 6 (FIG. 6F), delineated by appropriate masking, (601, 604, 623, 633, 643, 645, and 651) a single layer of a battery may be deposited which has internal and external edges which do not cause a shorting of the battery, but begin and end at a predetermined location down web.

FIG. 6G (step N) illustrates the sequential addition of subsequent delineated battery layers building up a battery cell. This illustrates the completed addition of (N) battery layers deposited through a masking device insuring a predetermined starting point and a predetermined ending point down web for each layer. A further illustration is of a connection pad located under the first current collector enabling the attachment of external leads.

Figure 7A:
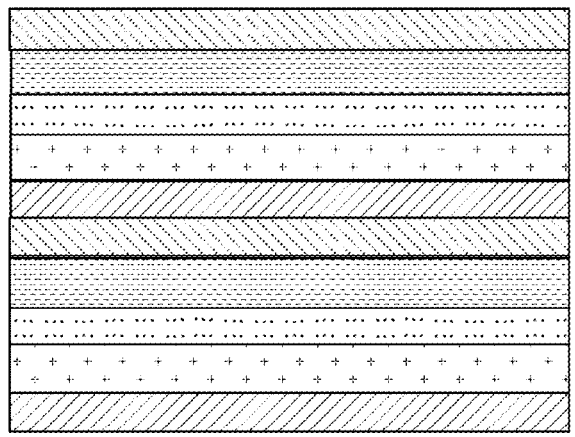
FIG. 7A is a simplified cross-sectional diagram illustrating a series monolithic interconnection of battery cells according to an embodiment of the present invention.
Figure 7B:
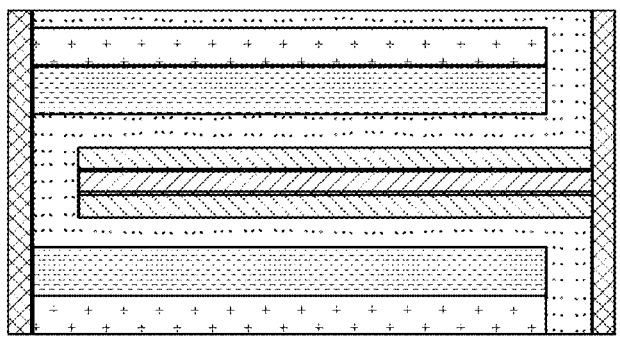
FIG. 7B is a simplified cross-sectional diagram illustrating a parallel monolithic interconnection of battery cells according to an embodiment of the present invention.

FIG. 7A is a simplified cross-sectional diagram illustrating a series monolithic interconnection of battery cells and FIG. 7B is a simplified cross-sectional diagram illustrating a parallel monolithic interconnection of battery cells according to an embodiment of the present invention. As illustrated in FIGS. 7a and 7b, by appropriate ordering of the sequential deposition of battery layers, both series connection for increased voltage and/or parallel connection for increased current capacity may be realized. This interconnection can be made by non-monotonically to produce batteries tailored to a particular application of voltage and current without any external interconnections.

Figure 8:
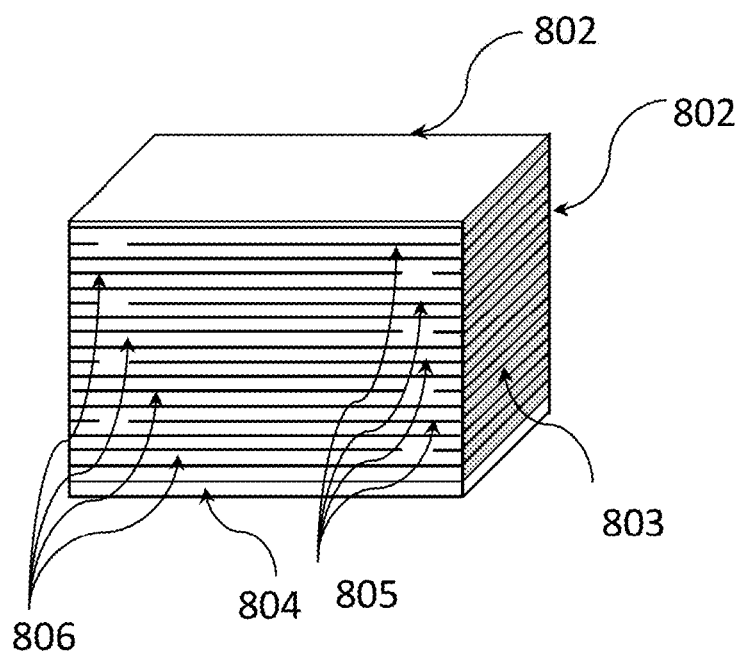
FIG. 8 is a simplified perspective diagram of a laser terminated single multi-stack battery device according to an embodiment of the present invention.

FIG. 8 is a simplified perspective diagram of a laser terminated single multi-stack battery device according to an embodiment of the present invention. FIG. 8 illustrates laser termination of single multi-stack battery. As it is shown in FIG. 8, to form a single multi-stack battery, the sheet is cut by a laser along lines 802, which define the battery side 803 to be terminated, and a cross cut is made to form a battery block of the desired size. A single multi-stack battery may have a rectangular or cylindrical geometry of desired thickness. The substrate 804 may be polymer, ceramic or glass about less than 10 μm. 805 and 806 are cathode and anode layers for termination.

Figure 9:
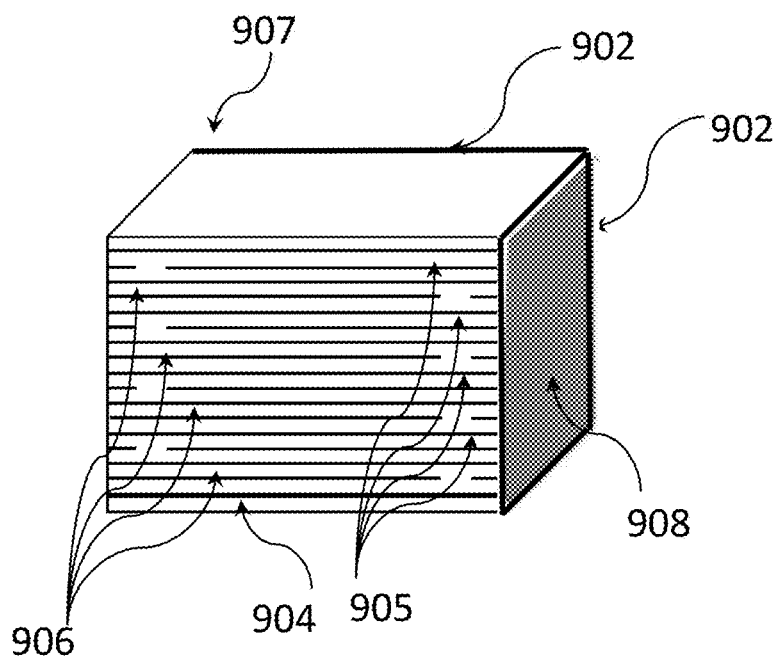
FIG. 9 is a simplified perspective diagram of a battery device terminated by deposition of nickel to each side of the cell according to an embodiment of the present invention.

FIG. 9 is a simplified perspective diagram of a battery device terminated by deposition of nickel to each side of the cell according to an embodiment of the present invention. FIG. 9 illustrates battery terminated by deposition of nickel to the each side of the cell. As it is shown in FIG. 9, in accordance with the invention, the sides 803 in FIG. 8 are coated with a film of nickel 908, to internally terminate the battery and to establish reliable electrical connections between all anode layers 906 on one side of the battery, and between all cathode layers 905 on the other side of the battery. A film of nickel 908 is vapor deposited on the battery sides 803 in FIG. 8 so as to coat those surfaces and to strengthen the exposed electrode ends. Nickel is selected, as it is economical, compatible with all battery layers, strong, and conductive. Other high electrically conductive materials may be used in addition to nickel, such as silver, aluminum, gold, copper, tungsten, zinc, iron platinum, carbon lead titanium, and many others. The substrate 904 may be polymer, ceramic or glass.

FIGS. 10A-10F are simplified cross-sectional diagrams illustrating a method for terminating and packaging a battery device according to an embodiment of the present invention. FIG. 10 shows entire terminations and packaging process, including internal and external process. In the first step, FIG. 10a, a single battery element 1001 is formed. Next, FIG. 10b, nickel side termination overlyer 1007 is deposited to the battery sides 3. In the next step, FIG. 10c, copper layer 1008 may be deposited through the process of vacuum deposition to overlayer nickel layer. Purpose of copper is to improve solderability and weldability of the nickel. In addition to copper other high solderable metals may be used in this step.

In FIG. 10d, the battery element 1001 is externally terminated as 1012 using tabs, strips, solid wires (magnetic and non-magnetic), stranded bare wires, stranded insulated wires, treaded stud terminals, bus bars, snap terminals, glass seal terminals, ceramic seal terminals, lugs, and braids.

Terminations may be attached to the nickel side termination overlayer 1007, which is overcoated with copper, by soldering, inductance soldering, ultrasonic soldering, capacitor discharge welding, resistance welding, ultrasonic welding, pulse arc welding, micro pulse arc welding, laser welding, spot welding, crimping, riveting, etc.

In next step, FIG. 10e, a terminated multi-stack solid-state battery is submitted to deposition of internal packaging layers 1013. Those layers are deposited in vacuum and are consisted of multi layers of PML, SiO2, metal, metal nitride, metal carbide, or metal oxide deposited on the top of each other, covering entire battery element 1001, including termination joints.

Finally, FIG. 10f shows external packaging of the battery element 1001. The external packaging is a conformal coating housing for a battery element 1001, further encapsulating the battery element 1001 in a polymer based coating. The external battery packaging 1004 provides conformal coating encapsulation for adequate rigidity and mechanical protection to the battery element 1001.

Figure 11A:
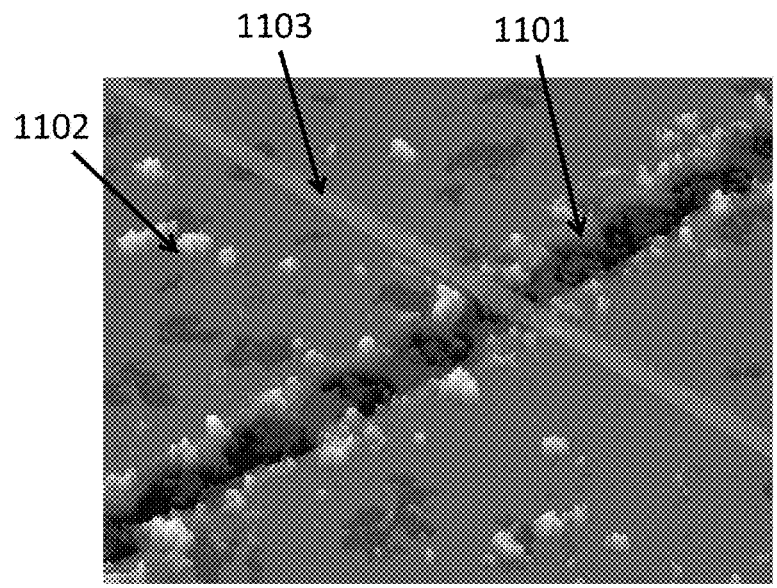
FIG. 11A is an image from a confocal microscope showing a processed region of a battery device according to an embodiment of the present invention.

FIG. 11A is an image from a confocal microscope showing a processed region of a battery device according to an embodiment of the present invention. FIG. 11a shows the image from confocal microscope with the processed region 1101 formed by laser ablation on the thin film solid state battery surface 1102. Surface profile measurement by the confocal microscope is along the optical scanning direction 1103.

Figure 11B:
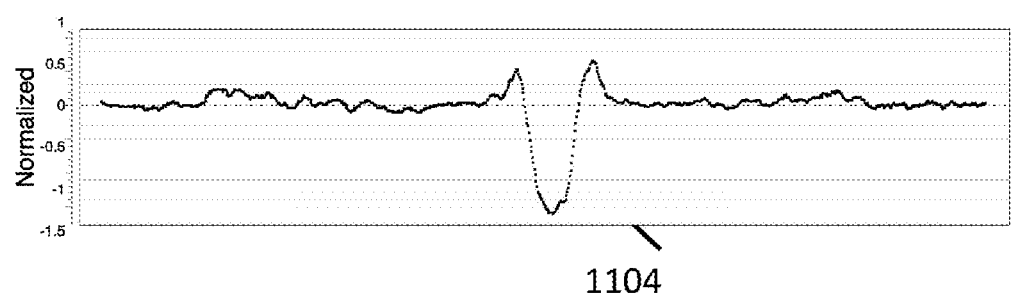
FIG. 11B is an image from a thickness scanning result of a processed region of a battery device according to an embodiment of the present invention.

FIG. 11B is an image from a thickness scanning result of a processed region of a battery device according to an embodiment of the present invention. FIG. 11b shows the scanning result. The material is removed and the trench 1104 with smooth surface is formed by laser ablation. By using the same method of laser ablation, the termination region can be formed by removing the battery materials.

Example 1

Optimization of Battery Terminations in t1

Figure 12A:
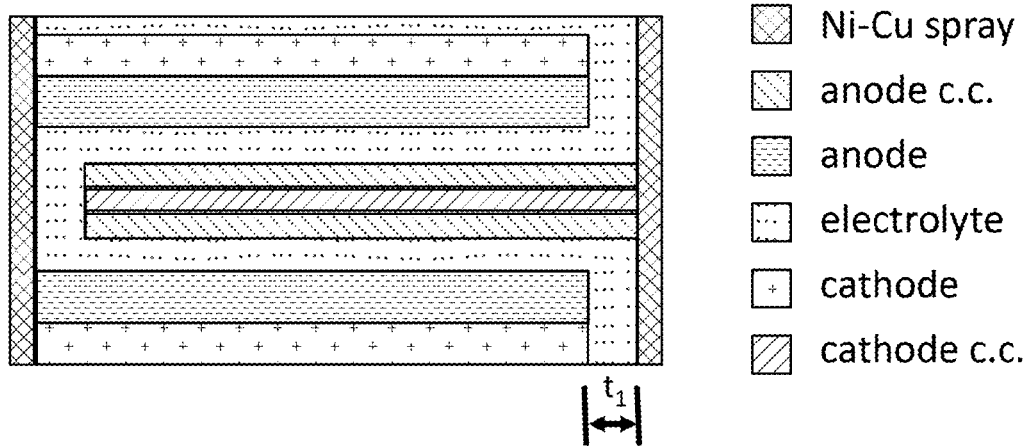
FIG. 12A is a simplified cross-sectional diagram of a battery device according to an embodiment of the present invention.

This example demonstrates the process of determination the optimal t1. FIG. 12A is a simplified cross-sectional diagram of a battery device according to an embodiment of the present invention. FIG. 12(a) shows the t1, which is the distance between anode terminating current collector and cathode current collector. As an example of the problems encountered by the battery designer, if t1 is longer, more electrolyte material is added in this area and it increases non-active material and further lower volumetric energy density and capacity. As in this example, numerical simulations of the electrochemical cell model are conducted with different values of t1.

Figure 12B:
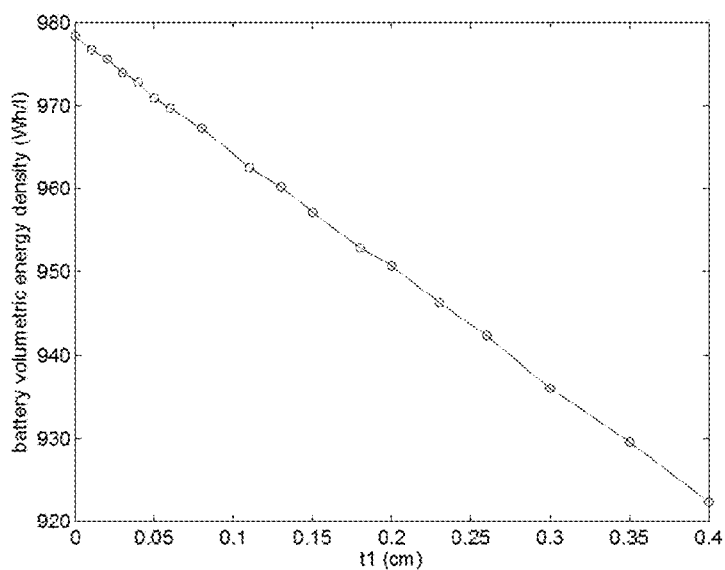
FIG. 12B is a graph of the relationship between volumetric energy density and thickness t1 according to an embodiment of the present invention.

FIG. 12B is a graph of the relationship between volumetric energy density and thickness t1 according to an embodiment of the present invention. FIG. 12(b) shows the relationship between t1 and the battery volumetric energy density from the simulation result. The smaller t1, the higher energy density can be achieved. This optimization process can help the battery designer to identify the terminations in t1 considering the trade-off between energy density of the cells and termination process.

Example 2

Forming the Terminations

Figure 13:
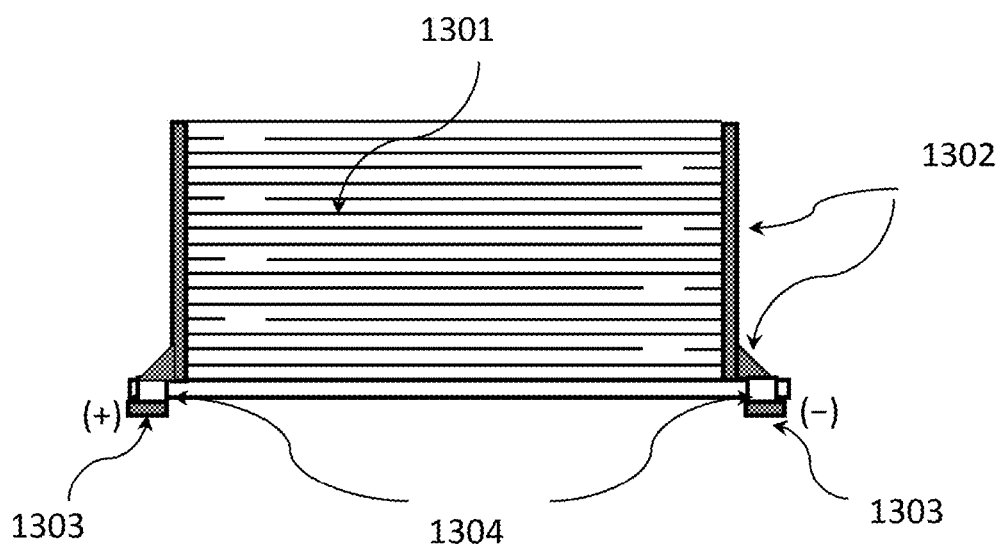
FIG. 13 is a simplified perspective diagram of a battery device according to embodiment of the present invention.

FIG. 13 is a simplified perspective diagram of a battery device according to embodiment of the present invention. This example demonstrates the process of forming the termination layer. FIG. 13 shows the battery stack in zig-zag multilayer format as cells in parallel connection as 1301. Battery termination layer 1302 is deposited through spraying application. Other applications such brushing, rolling, dipping, and welding can be used too. Sprayed layer is then connected to the rivets insert through the substrate as shown in 1304 and tabs 1303 are attached to the battery from the bottom.

In an embodiment, the present invention includes a method for fabricating a solid state battery device comprising layers of anode, cathode, separator, electrolyte, current collectors, substrate, and overlaying barrier material, with an inter-digitated layer structure configured with a post terminated lead structure. The method can include:

forming a plurality of battery device cell regions formed in a multi-stacked configuration, the plurality of battery device cell regions being numbered from 1 through N, where N is an integer greater than 1; wherein each of the battery device cell regions comprises a first current collector and a second current collector, the first current collector extending spatially outside of the battery device cell region and the second current collector extending spatially outside of the battery device cell region;

forming, using at least a first deposition process, a thickness of a first lead material to cause formation of a first lead structure to interconnect each of the first current collectors associated with each of the plurality of battery device cell regions and to isolate each of the second current collectors extending spatially outside of the battery device cell region within a first isolated region; and forming, using a least a second deposition process, a thickness of a second lead material to cause formation of a second lead structure to interconnect each of the second current collectors associated with each of the plurality of battery cell regions and to isolate each of the first current collectors extending spatially outside of the battery device cell region within a second isolated region.

In an embodiment, forming the plurality of battery device cell regions comprises using materials that are fed into a production chamber via a process involving source material feeder utilizing conveyor belt, hopper, auger, screw, wire spool, and cartridge in order to achieve continuous deposition of multilayers under a single vacuum.

In a specific embodiment, the fabricating technique can include Physical Vapor Deposition (PVD) by thermal means, by e-beam heating, by resistance heating, by induction heating, by ion beam heating, by laser ablation, by pulsed laser deposition (PLD), by molecular beam epitaxy, by Ion Beam Assisted Deposition (IBAD), by close coupled sublimation, by gas cluster ion beam, all with or without bias and their combinations; Physical Vapor Deposition (PVD) by momentum transfer, by diode sputtering, by magnetron sputtering, by unbalanced magnetron sputtering, by high power impulse magnetron sputtering, by RF sputtering, by DC sputtering, by MF sputtering, by cylindrical sputtering, by hollow cathode sputtering, by sputter evaporation, by ion beam sputtering, by sputter ion cluster, by bias sputtering, by cathodic arc, by filtered cathodic arc, and their combinations; Physical Deposition (PD) by direct material transfer, by metal powder spraying, by plasma spraying, by arc spraying, by flame spraying, by rod flame (Rokide) spraying, by autocatalytic spraying; Reactive PVD by background gas, by Ion Beam Assisted Deposition (IBAD), by plasma activated PVD, and by their combinations; Chemical Vapor Deposition (CVD) by upstream plasma activation, by down stream plasma activation, by thermal activation, by laser induced activation, by UV activation, by ion activation, by electron beam activation, by catalytic activation, by gas phase activation and by their combinations, reactive CVD by background gas, by Ion Beam Assisted Deposition (IBAD), by plasma activated CVD, and by their combinations; Atomic Layer Deposition (ALD) by sequentially pumping and filling a chamber, by sequential chambers of vacuum and vapor, by adding thermal energy, by adding ion beam energy, by adding laser energy, by adding UV energy and by their combinations.

In an embodiment, the first lead material and the second lead material are formed as termination regions by removing or defining the battery device cell regions by a process selected from etching, masking, laser ablation, and micromachining. A length of the first isolated region and a length of the second isolated region are configured to reduce non-active materials to achieve high energy density.

In an embodiment, the present invention can include a solid state battery device a substrate member comprising a surface region, the substrate member having a length and a width; a plurality of cathode electrode members configured from a first end to a second end and overlying the substrate member, each of the plurality of cathode electrode members comprising an outer end and an inner end; a plurality of anode electrode members configured from the second end to the first end and overlying the substrate member, each of the plurality of the plurality of anode electrode members comprising an outer end and an inner end; wherein the plurality of cathode electrode members and the plurality of anode electrode members are arranged in an inter-digitated configuration; a cathode termination region formed overlying each of the outer ends of the plurality of cathode electrode members; an anode termination region formed overlying each of the outer ends of the plurality of anode electrode members; and an electrolyte material provided between each pair of cathode electrode members and anode electrode members.

In a specific embodiment, each of the anode termination region and the cathode termination region is provided by one of welding, soldering, spraying, painting, ultrasonic welding, brushing, dipping, and similar process and similar process. each pair of anode electrode members and cathode electrode members comprises a single battery cell. The plurality of anode electrode members are configured in parallel or serial arrangement and coupled to the anode or cathode termination region; and wherein the plurality of cathode electrode members are configured in parallel or serial arrangement and coupled to the cathode or anode termination region.

The device can also include a first tab electrically and mechanically coupled to a first portion of the substrate, the first portion being coupled to the anode termination region; and further comprising a second tab electrically and mechanically coupled to a second portion of the substrate, the second portion being coupled to the cathode termination region; wherein the first portion and the second portion being opposite of the surface region of the substrate. the electrical and mechanical coupling comprise attached leads, tabs, wires, and other connectors to the anode and cathode termination by one of resistance welding, ultrasonic welding, laser welding, pulse arc welding, capacitor discharge welding, spot welding, ultrasonic soldering, spraying, painting, ultrasonic welding, brushing, dipping, brazing, crimping, adhesion, pinning, and similar process.

In an embodiment, the present invention can include a method for forming internal packaging layers for a multilayer solid state battery device. The method can include forming an internal packaging multilayer within the multilayer solid state battery device that defines an upper surface, front surface, rare surface, and side surface, including the termination joints, wherein the internal packaging multilayer includes a plurality of PML, SiO2, metal, metal nitride, metal carbide and metal oxide layers and provide hermetical seal and serves as a moisture barrier to the multilayer solid state battery device.

In a specific embodiment, the internal packaging multilayer comprises a packaging PML layer thickness ranging from 0.5 μm to 100 μm and a SiO2, metal, metal nitride, metal carbide, or metal oxide layer thickness ranging from 0.03 μm to 10 μm. The metal of the internal packaging multilayer includes, but is not limited to, Al, Ti, Mg and PML, and materials including acrylate, acrylic ester or other polymers. The internal packaging multilayer can provide a hermetic enclosure of the battery element, wherein the internal packaging multilayer is characterized by a water vapor transmission rate of $\leq 10^{-5}$ g/m$^2$/day.

In a specific embodiment, forming the internal packaging multilayer comprises forming a conformal coating housing for a battery element, further encapsulating the battery element in a polymer based coating, wherein the conformal coating provides adequate rigidity, and mechanical protection to the battery element and serves as an external packaging layer, and conformal coating comprises additional moisture barrier and static discharge material. The conformal coating is configured with adequate rigidity and mechanical protection to the battery element and serves as an external packaging layer.

In a specific embodiment, the polymer based coating is formed from one or two components selected from epoxy resin, UV curable epoxy, thermoplastics, acrylate ceramics, polyurethane, silicone, liquid crystals, silica, carbon black. The polymer coating layer is formed by dip coating, shrink wrap, spray coating, flow coating, emulsion coating, and their combinations. The conformal coating layer thickness ranges from 10 μm to 1000 μm It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a solid state battery device comprising layers of anode, cathode, separator, electrolyte, current collectors, substrate, and overlaying barrier material, with an inter-digitated layer structure configured with a post terminated lead structure, the method comprising:
    forming a plurality of battery device cell regions formed in a multi-stacked configuration, the plurality of battery device cell regions being numbered from 1 through N, where N is an integer greater than 1; wherein each of the battery device cell regions comprises a first current collector and a second current collector, the first current collector extending spatially outside of the battery device cell region and the second current collector extending spatially outside of the battery device cell region;
    forming, using at least a first deposition process, a thickness of a first lead material to cause formation of a first lead structure to interconnect each of the first current collectors associated with each of the plurality of battery device cell regions and to isolate each of the second current collectors extending spatially outside of the battery device cell region within a first isolated region; and
    forming, using a least a second deposition process, a thickness of a second lead material to cause formation of a second lead structure to interconnect each of the second current collectors associated with each of the plurality of battery cell regions and to isolate each of the first current collectors extending spatially outside of the battery device cell region within a second isolated region.

2. The method of claim 1 wherein forming the plurality of battery device cell regions comprises using materials that are fed into a production chamber via a process involving source material feeder utilizing conveyor belt, hopper, auger, screw, wire spool, and cartridge in order to achieve continuous deposition of multilayers under a single vacuum.

3. The method of claim 1 wherein forming the plurality of battery device cell regions comprises a process selected from physical vapor deposition (PVD), pulsed laser deposition (PLD), physical deposition (PD), chemical vapor deposition (CVD), atomic layer deposition (ALD), ion beam assisted deposition (IBAD).

4. The method of claim 1 wherein the first lead material and the second lead material are formed as termination regions by removing or defining the battery device cell regions by a process selected from etching, masking, laser ablation, and micro-machining.

5. The method of claim 1 wherein a length of the first isolated region and a length of the second isolated region are configured to reduce non-active materials to achieve high energy density.

* * * * *